(12) United States Patent
Cheon (10) Patent No.: US 11,437,576 B2
(45) Date of Patent: Sep. 6, 2022

(54) DEPOSITION APPARATUS AND METHOD OF FABRICATING DISPLAY DEVICE USING THE SAME

(71) Applicant: Samsung Display Co., Ltd., Yongin-Si (KR)

(72) Inventor: Seonghyeon Cheon, Gwacheon-si (KR)

(73) Assignee: Samsung Display Co., Ltd.

( * ) Notice: Subject to any disclaimer, the term of this patent is extended or adjusted under 35 U.S.C. 154(b) by 92 days.

(21) Appl. No.: 16/579,464

(22) Filed: Sep. 23, 2019

(65) Prior Publication Data

US 2020/0119277 A1 Apr. 16, 2020

(30) Foreign Application Priority Data

Oct. 12, 2018 (KR) ........................ 10-2018-0121944

(51) Int. Cl.
*H01L 51/56* (2006.01)
*H01L 51/00* (2006.01)

(52) U.S. Cl.
CPC ........ *H01L 51/0007* (2013.01); *H01L 51/001* (2013.01); *H01L 51/0004* (2013.01); *H01L 51/56* (2013.01)

(58) Field of Classification Search
CPC . H01L 51/0007; H01L 51/56; H01L 51/0004; H01L 51/001; H01L 27/3244; C23C 16/4405; C23C 16/405; C23C 16/45574; C23C 16/45561; C23C 16/45565; C23C 16/45568; C23C 16/46
USPC ........................ 118/715; 156/345.33, 345.34
See application file for complete search history.

(56) References Cited

U.S. PATENT DOCUMENTS

| | | | |
|---|---|---|---|
| 4,436,769 A | 3/1984 | Moss et al. | |
| 5,702,532 A | 12/1997 | Wen et al. | |
| 7,838,403 B1 | 11/2010 | Liu et al. | |
| 2006/0228898 A1 | 10/2006 | Wajda et al. | |
| 2007/0178249 A1 | 8/2007 | Song et al. | |
| 2009/0061648 A1* | 3/2009 | Horii | C23C 16/45561 438/778 |
| 2016/0060785 A1 | 3/2016 | Wang | |
| 2016/0163905 A1 | 6/2016 | Palm et al. | |

FOREIGN PATENT DOCUMENTS

KR 10-2008-0002908 A 1/2008
KR 10-1231987 B1 2/2013

\* cited by examiner

*Primary Examiner* — Rudy Zervigon
(74) *Attorney, Agent, or Firm* — Innovation Counsel LLP (57) ABSTRACT

A method and a deposition apparatus of fabricating a display device is disclosed. The method may include providing a target substrate in an internal space of a chamber of a deposition apparatus, depositing a first material which includes an organic material and a deposition material coupled to each other, on the target substrate to form preliminary deposition layer, performing a preliminary decomposition step to remove the organic material, and performing a decomposition step to remove the organic material remained in the preliminary deposition layer and to form a deposition layer. The preliminary decomposition step may include heating the preliminary deposition layer, and the decomposition step may include injecting a second material containing an organic solvent onto the preliminary deposition layer.

6 Claims, 9 Drawing Sheets

DEPOSITION APPARATUS AND METHOD OF FABRICATING DISPLAY DEVICE USING THE SAME

CROSS-REFERENCE TO RELATED APPLICATIONS

This U.S. non-provisional patent application claims priority under 35 U.S.C. § 119 to Korean Patent Application No. 10-2018-0121944, filed on Oct. 12, 2018, in the Korean Intellectual Property Office, the entire contents of which are hereby incorporated by reference.

BACKGROUND OF THE INVENTIVE CONCEPT

The present disclosure relates to a deposition apparatus and a method of fabricating a display device using the same, and in particular, to a deposition apparatus with improved process efficiency and a method of fabricating a display device using the same.

A plurality of thin films are provided in each of display devices, semiconductor devices, and other electronic devices. Various vapor deposition processes may be used to form the thin film.

Especially, a chemical vapor deposition (CVD) process is most widely used as a technology of forming the thin film. In the chemical vapor deposition method, the thin film is formed through a chemical reaction. For example, an insulating layer or an electrode layer may be formed on a surface of a target layer (e.g., a substrate) through a chemical reaction of a precursor material.

With recent increasing demand for a highly scaled display device with high efficiency and high output characteristics, there is an increasing interest in an apparatus for the thin film deposition process.

SUMMARY

An embodiment of the inventive concept provides a deposition apparatus with improved process efficiency and a method of fabricating a display device using the same.

An embodiment of the inventive concept provides a deposition apparatus with an improved cleaning efficiency.

According to an embodiment of the inventive concept, a deposition apparatus may include a chamber providing a specific internal space, the chamber including a stage disposed in the internal space and on which a target substrate is disposed, a first supplying part connected to the chamber and providing a first material into the internal space, a second supplying part spaced apart from the first supplying part and connected to the chamber, the second supplying part storing a second material different from the first material and providing the second material into the internal space, a shower head disposed in the internal space and connected to the first supplying part and the second supplying part, the shower head including a nozzle injecting the first material or the second material toward the target substrate. The first material may include an organic material and a deposition material, and the second material may include an organic solvent decomposing the organic material of the first material.

In an embodiment, the deposition apparatus may further include a first supply line connecting the first supplying part to the chamber, and a second supply line connecting the second supplying part to the chamber. The first material may be provided to the shower head through the first supply line, and the second material may be provided to the shower head through the second supply line.

In an embodiment, the deposition apparatus may further include a vacuum pump connected to the chamber.

In an embodiment, the deposition apparatus may further include a pressure gauge measuring an internal pressure of the chamber, and a pressure controller connected to the pressure gauge. The pressure controller may be connected to the vacuum pump.

In an embodiment, the deposition apparatus may further include a precursor supplying part connected to the first supplying part to store the first material, and a gas supplying part connected to the precursor supplying part to provide a gas to the precursor supplying part.

In an embodiment, the deposition apparatus may further include a flow controller disposed between the precursor supplying part and the gas supplying part to control a flow rate of the gas.

According to an embodiment of the inventive concept, a method of fabricating a display device may include providing a target substrate in an internal space of a chamber of a deposition apparatus, depositing a first material which includes an organic material and a deposition material coupled to each other on the target substrate to form preliminary deposition layer, performing a preliminary decomposition step to remove the organic material, and performing a decomposition step to remove the organic material remained in the preliminary deposition layer and to form a deposition layer. The decomposition step may include injecting a second material containing an organic solvent onto the preliminary deposition layer.

In an embodiment, the preliminary decomposition step and the decomposition step may be performed in the internal space of the chamber without breaking a vacuum.

In an embodiment, the deposition apparatus may include a first supplying part storing the first material, a first supply line connecting the first supplying part to the chamber, a second supplying part storing the second material, a second supply line connecting the second supplying part to the chamber, a precursor supplying part storing the first material, a gas supplying part connected to the precursor supplying part to provide a reaction gas, a gas line connecting the precursor supplying part and the gas supplying part to the chamber, a vacuum pump controlling an internal pressure of the chamber, a vacuum line connecting the vacuum pump to the chamber, and a cleaning line connecting the vacuum pump to the gas line.

In an embodiment, the deposition apparatus may further include supplying a reaction gas to transport the first material into the chamber.

In an embodiment, the method may further include adjusting a flow rate of the reaction gas using a flow controller.

In an embodiment, the method may further include cleaning the deposition apparatus.

In an embodiment, the cleaning of the deposition apparatus may be performed by circulating the second material through the first supply line, the gas line, the vacuum line, and the cleaning line.

In an embodiment, the method may further include controlling an internal pressure of the chamber.

In an embodiment, the chamber may include a shower head connected to the first supply line and the second supply line, the shower head including a nozzle injecting the first material or the second material toward the target substrate, and a stage disposed to face the shower head and to support the target substrate.

In an embodiment, the preliminary decomposition step may include heating the preliminary deposition layer, and the heating of the decomposition step may be performed using heat provided from the stage.

In an embodiment, the method may further include controlling an open/close operation of each of the first supply line, the second supply line, the gas line, the vacuum line, and the cleaning line, using respective valves.

According to an embodiment of the inventive concept, a method of fabricating a display device may include providing a target substrate in an internal space of a chamber of a deposition apparatus, providing a first material from a first supplying part to the target substrate to form a preliminary deposition layer on the target substrate, the first material including an organic material and a deposition material coupled to each other, performing a decomposition step to remove the organic material from the preliminary deposition layer and to form a deposition layer on the target substrate, the decomposition step including injecting a second material which is supplied from a second supplying part and contains an organic solvent onto the preliminary deposition layer, and cleaning the chamber and the first supplying part. The cleaning may be performed by circulating the second material, which is provided from the second supplying part through the chamber and the first supplying part.

In an embodiment, the method may further include performing a preliminary decomposition step to remove the organic material before the performing of the decomposition step. The preliminary decomposition step may include heating the target substrate on which the preliminary deposition layer is formed.

In an embodiment, the deposition apparatus may include a first supply line connecting the first supplying part to the chamber, a second supply line connecting the second supplying part to the chamber, a precursor supplying part storing the first material, a gas supplying part connected to the precursor supplying part to supply a reaction gas, a gas line connecting the precursor supplying part and the gas supplying part to the chamber, a vacuum pump controlling an internal pressure of the chamber, a vacuum line connecting the vacuum pump to the chamber, a cleaning line connecting the vacuum pump to the gas line. The cleaning of the chamber and the first supplying part may be performed by circulating the second material through the first supply line, the gas line, the vacuum line, and the cleaning line.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some embodiments of the inventive concept will be described with reference to FIGS. 1 to 5C.

Figure 1:
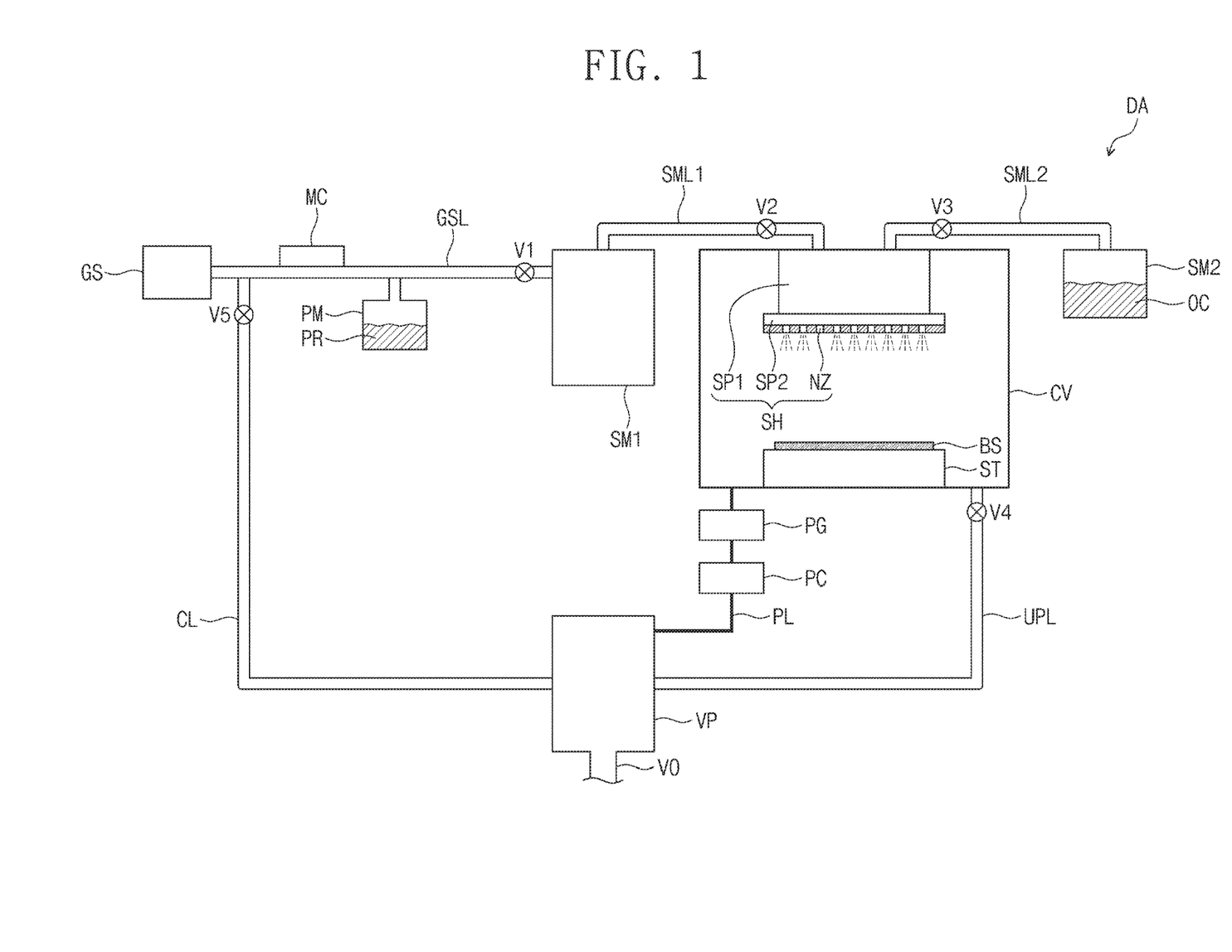
FIG. 1 is a sectional view schematically illustrating a deposition apparatus according to an embodiment of the inventive concept.
Figure 2:
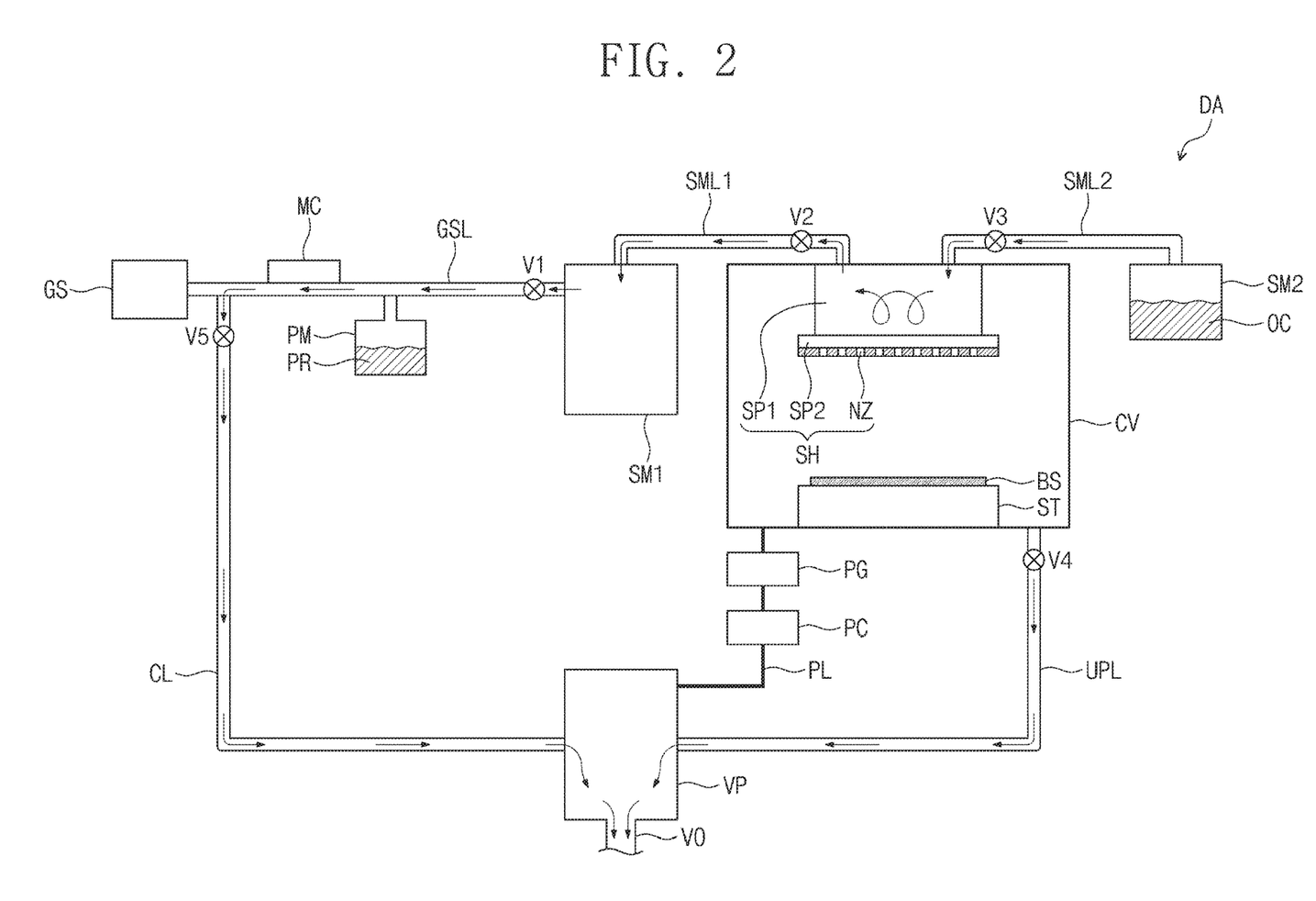
FIG. 2 is a sectional view schematically illustrating a deposition apparatus according to an embodiment of the inventive concept.

FIG. 1 is a sectional view schematically illustrating a deposition apparatus according to an embodiment of the inventive concept. FIG. 2 is a sectional view schematically illustrating a deposition apparatus according to an embodiment of the inventive concept.

Referring to FIG. 1, a deposition apparatus DA according to an embodiment of the inventive concept may include a chamber CV, a first supplying part SM1, a second supplying part SM2, a precursor supplying part PM, a gas supplying part GS, a flow controller MC, a vacuum pump VP, a pressure gauge PG, a pressure controller PC, supply lines, and valves. The supply lines may be used to connect the above elements, and each of the valves may be used to control an open/close operation of a corresponding one of the supply lines.

The chamber CV may include a stage ST, a target substrate BS, and a shower head SH. The chamber CV may be configured to provide an internal space in which a deposition process is performed. The internal space of the chamber CV may be hermitically sealed from the external atmosphere. The chamber CV may isolate the target substrate BS from the external atmosphere, and the internal space of the chamber CV may be used to perform a deposition process for forming a thin film on the target substrate BS. Although not shown, a door may be provided in a sidewall of the chamber CV to allow the target substrate BS to enter and exit the internal space of the chamber CV. The chamber CV may be formed of a stainless steel and so forth, but the inventive concept is not limited thereto.

The stage ST may be disposed in the internal space of the chamber CV. In an embodiment, the stage ST may be disposed in a lower region of the chamber CV to support the target substrate BS. The stage ST may include a fastening element (not shown) for fastening the target substrate BS and a driving element (not shown) for controlling a vertical or rotational motion of the stage ST. The fastening element may be a clamp, a pressure member, an adhesive material, and so forth, but the inventive concept is not limited thereto. The stage ST may be a vacuum chuck which uses a vacuum force to fix the target substrate on the vacuum chuck during the deposition process.

The target substrate BS may be a layer, on which a thin film is formed by the deposition process. The target substrate BS may be provided as a base layer, on which elements of the display device are disposed, or as a layer, in which some elements of the display device are formed. For example, the target substrate BS may be provided to have a transistor, which is one of elements constituting a pixel displaying an image, but the inventive concept is not limited to this example. The thin film on the target substrate BS will be described below.

The shower head SH may include an entrance part SP1 and an injecting part SP2. The shower head SH may be disposed in the internal space of the chamber CV. In an embodiment, the shower head SH may be disposed in an upper region of the chamber CV. The shower head SH may be disposed to face the target substrate BS. The entrance part SP1 may have an empty space, in which deposition materials such as deposition gases, precursors and organic solvents to be injected onto the target substrate BS can be contained. The injecting part SP2 may include a plurality of nozzles NZ. The nozzles NZ may inject the deposition materials which are provided from the entrance part SP1 toward the target substrate BS.

The precursor supplying part PM may store a first material PR. In an embodiment, the first material PR may be defined as a precursor containing a deposition material and an organic material. In an embodiment, the deposition material may contain a metallic element. That is, the first material PR may be a metal organic precursor.

For example, the deposition material may contain at least one of aluminum (Al), titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb).

The gas supplying part GS may inject a reaction gas which may be used in a deposition process. The reaction gas provided from the gas supplying part GS may react with the first material PR and may create an environment suitable for forming a thin film on the target substrate BS. The reaction gas provided from the gas supplying part GS may be continuously supplied during a period from a starting point of a deposition process to an ending point. The reaction gas provided from the gas supplying part GS is not limited to a specific kind, and the gas supplying part GS may store various reaction gases, depending on the kind of the thin film to be formed on the target substrate BS.

In an embodiment, a gas line GSL may connect the gas supplying part GS, the precursor supplying part PM and the first supplying part SM1. The gas line GSL may include a first valve V1. The first valve V1 may control an open/close operation of the gas line GSL and may control a flow of an incoming material, which is provided from the precursor supplying part PM to the first supplying part SM1 or is provided from the first supplying part SM1 to the precursor supplying part PM.

In an embodiment, the deposition apparatus DA may include the flow controller MC which controls an amount of the material passing through the gas line GSL. The flow controller may be a mass flow controller which is a device used to measure and control the flow of liquids and gases. The flow controller MC may be disposed on the gas line GSL disposed between the gas supplying part GS and the precursor supplying part PM. The flow controller MC may control an amount of the reaction gas provided from the gas supplying part GS to realize an environment suitable for forming a thin film on the target substrate BS. The first valve may include a flow controller MC.

The first supplying part SM1 may store a source gas containing the reaction gas and the first material PR. The source gas may be injected onto the target substrate BS through the shower head SH during the deposition process.

In an embodiment, a first supply line SML1 may connect the first supplying part SM1 to the chamber CV. The first supply line SML1 may be connected to a portion of the shower head SH of the chamber CV. For example, the first supply line SML1 may be connected to a portion of the entrance part SP1. The first supply line SML1 may include a second valve V2. The second valve V2 may control an open/close operation of the first supply line SML1 and may control a flow of an incoming material, which is provided from the first supplying part SM1 to the chamber CV or is provided from the chamber CV to the first supplying part SM1. The second valve V2 may include a flow controller MC to exactly control an amount of the source gas containing the reaction gas and the first material PR.

In an embodiment, the second supplying part SM2 may store a second material OC. In an embodiment, the second material OC may include an organic solvent. The second material OC may contain one of materials that can decompose the organic material contained in the first material PR. Thus, the second material OC may be variously changed depending on the kind of the first material PR and may not be limited to a specific material.

In an embodiment, a second supply line SML2 may connect the second supplying part SM2 to the chamber CV. The second supply line SML2 may be connect to another portion of the shower head SH in the chamber CV. For example, the second supply line SML2 may be connected to another portion of the entrance part SP1. In an embodiment, the second supply line SML2 may be spaced apart from the first supply line SML1. Thus, in the deposition apparatus DA according to an embodiment of the inventive concept, it may be possible to inject both of the first material PR which contains a metal organic precursor and the second material OC which can decompose an organic material contained in the first material PR into the chamber CV.

The second supply line SML2 may include a third valve V3. The third valve V3 may control an open/close operation of the second supply line SML2 and may control a flow of an incoming material which is provided from the second supplying part SM2 to the chamber CV and is provided from the chamber CV to the second supplying part SM2. The third valve may include a flow controller MC to exactly control an amount of the incoming material which is provided from the second supplying part SM2 to the chamber CV.

The vacuum pump VP may include a venting part VO. The vacuum pump VP may be connected to a portion of the chamber CV. The vacuum pump VP may be used to maintain the internal space of the chamber CV in a vacuum state, during the deposition process. The venting part VO may be used as a pathway for exhausting contamination materials and remaining gas from the chamber CV and the supply lines of the deposition apparatus DA to the outside. The vacuum pump VP may control an internal pressure of the chamber CV (e.g., to a high or low vacuum pressure).

In an embodiment, a vacuum line UPL may connect the vacuum pump VP to the chamber CV. The vacuum line UPL may be used to adjust the internal pressure of the chamber CV. In addition, the vacuum line UPL may be used to transport contamination materials and a remaining gas in the chamber CV to the vacuum pump VP, during cleaning the chamber CV. The vacuum line UPL may include a fourth valve V4. The fourth valve V4 may control an open/close operation of the vacuum line UPL and may control a flow of an incoming material which is provided from the chamber CV to the vacuum pump VP or is provided from the vacuum pump VP to the chamber CV.

The pressure gauge PG may be connected to the chamber CV and may measure an internal pressure of the chamber CV. A portion of the pressure controller PC may be connected to the pressure gauge PG and another portion of the pressure controller PC may be connected to the vacuum pump VP. Information on the internal pressure of the chamber CV measured by the pressure gauge PG may be transmitted to the pressure controller PC, and the pressure controller PC may control the vacuum pump VP based on the internal pressure information from the pressure gauge PG, thereby allowing the chamber CV to have an internal pressure suitable for the deposition process.

In an embodiment, the deposition apparatus DA may include a cleaning line CL. In an embodiment, the cleaning line CL may connect the gas line GSL to the vacuum pump VP. When a cleaning step is performed on supply lines connecting the chamber CV to the gas supplying part GS, the cleaning line CL may be used to transport contamination materials and remaining gas which remain in the supply lines to the vacuum pump VP. The cleaning line CL may include a fifth valve V5. The fifth valve V5 may control an open/close operation of the cleaning line CL and may control a flow of contamination materials and remaining gas to be transported from the supply lines to the vacuum pump VP.

In FIG. 2, the arrows illustrate exhausting paths of the organic material and remaining gas which remain in the internal space of the deposition apparatus DA in the cleaning step.

In an embodiment, after the deposition process, the organic material contained in the first material PR may be accumulated in the gas line GSL, the first supplying part SM1, the first supply line SML1, the chamber CV, and the vacuum line UPL. In an embodiment, the second material OC provided from the second supplying part SM2 may contain an organic solvent capable of removing the first material PR, and thus, during the cleaning process of the deposition apparatus DA, the second material OC may be used as a cleaning agent for removing remaining organic materials accumulated in the deposition apparatus DA.

In other words, by supplying the second material OC into the internal space of the deposition apparatus DA (e.g., into the gas line GSL, the first supplying part SM1, the first supply line SML1, the chamber CV, and the vacuum line UPL), it may be possible to remove the remaining organic material.

In the deposition apparatus DA according to an embodiment of the inventive concept, the first material PR containing the metal organic precursor and the second material OC which can decompose the organic material in the first material PR may be injected into the chamber CV. Accordingly, it is not necessary to perform an additional step for controlling pressure and vacuum state to decompose the organic material contained in the metal organic precursor (e.g., the first material PR), and thus, it is possible to reduce process cost and time by using the deposition apparatus described in an embodiment of the inventive concept.

In addition, by providing the second material OC which is effective in removing the organic material contain in the first material PR in the internal space of the deposition apparatus, it may be possible to reduce time required to clean the deposition apparatus DA. Thus, in the case where the deposition apparatus DA is used to deposit a thin film, it may be possible to improve process efficiency of a thin film forming process.

Figure 3:
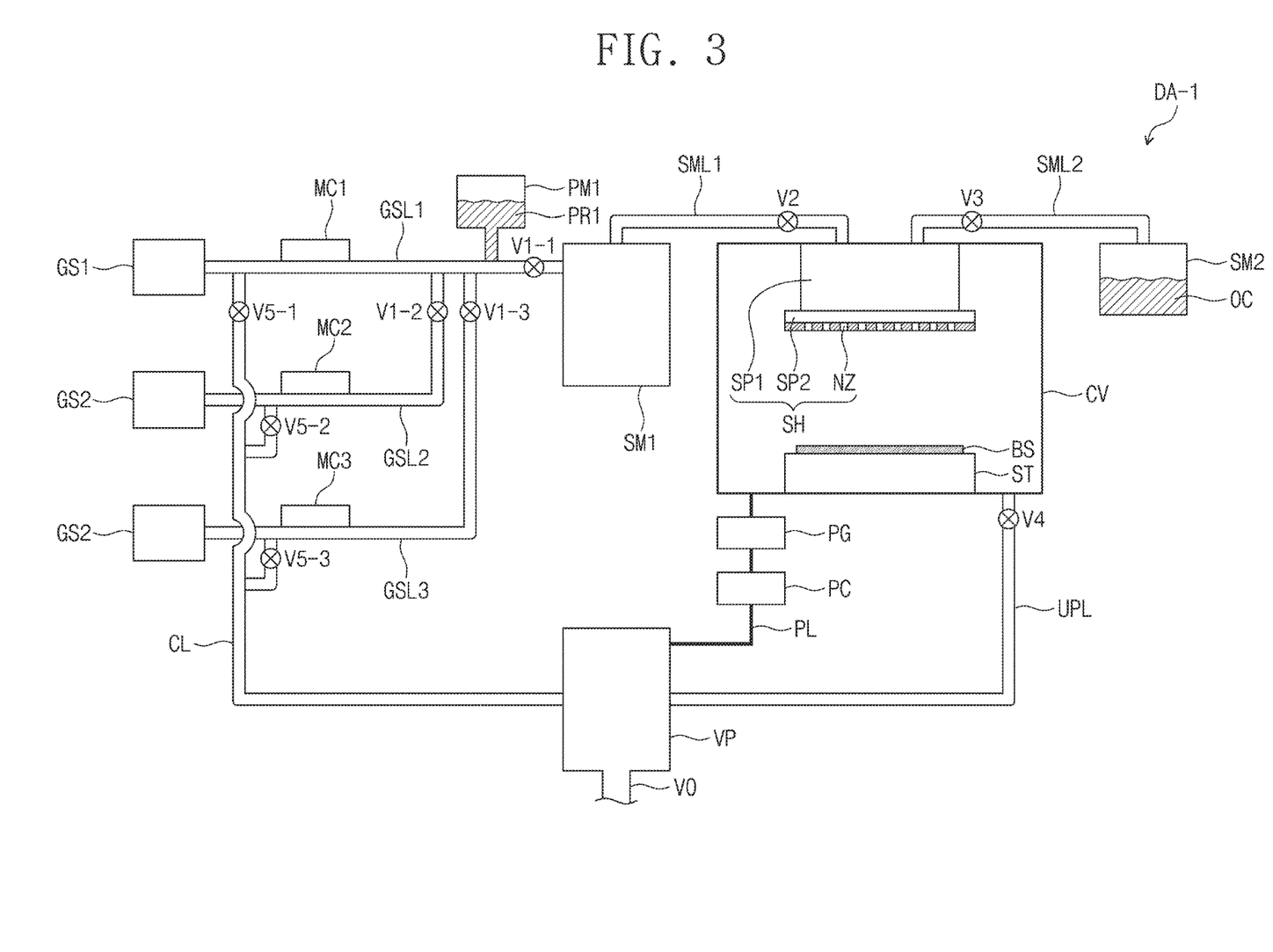
FIG. 3 is a sectional view schematically illustrating a deposition apparatus according to an embodiment of the inventive concept.

FIG. 3 is a sectional view schematically illustrating a deposition apparatus according to an embodiment of the inventive concept. In the following description, the same element as that of FIG. 1 will be identified by the same or similar reference number without repeating an overlapping description thereof.

Referring to FIG. 3, a deposition apparatus DA-1 according to an embodiment of the inventive concept may include gas supplying parts GS1, GS2, and GS3 and gas supply lines GSL1, GSL2 and GSL3 which are connected to the gas supplying parts GS1, GS2, and GS3, respectively. In addition, the deposition apparatus DA-1 may include flow controllers MC1, MC2, and MC3 and valves V1-1, V1-2, and V1-3, which are connected to the gas supply lines GSL1, GSL2, and GSL3, respectively.

A first gas supplying part GS1, a first gas line GSL1, a first flow controller MC1, and a first valve V1-1 may correspond to the gas supplying part GS, the gas line GSL, the flow controller MC, and the first valve V1 described with reference to FIG. 1.

A second gas supplying part GS2 may be connected to the first supplying part SM1 through a second gas line GSL2. A second flow controller MC2 may be disposed on the second gas line GSL2 to control an amount or flow rate of a gas which is provided from the second gas supplying part GS2 to the first supplying part SM1.

A third gas supplying part GS3 may be connected to the first supplying part SM1 through a third gas line GSL3. A third flow controller MC3 may be disposed on the third gas line GSL3 to control an amount or flow rate of a gas which is provided from the third gas supplying part GS3 to the first supplying part SM1.

In an embodiment, each of the gas supplying parts GS1, GS2, and GS3 may contain a reaction gas required for a deposition process. Each of the reaction gases supplied from the gas supplying parts GS1, GS2, and GS3 may be used to transport a first material PR1 to the chamber CV. Furthermore, each of the reaction gases supplied from the gas supplying parts GS1, GS2, and GS3 may also be used to maintain a process pressure of the internal space of the chamber CV. For example, each of the reaction gases supplied from the gas supplying parts GS1, GS2, and GS3 may contain one of silane ($SiH_4$), ammonia ($NH_3$), nitrogen ($N_2$), oxygen ($O_2$), argon (Ar), and hydrogen ($H_2$) gases. However, the inventive concept is not limited to these examples, and the kind of the reaction gas may be variously changed, depending on the kind of a deposition layer to be formed on the target substrate BS, and may not be limited to a specific material.

In addition, although three gas supply lines GSL1, GSL2, and GSL3, which are respectively connected to three gas supplying parts GS1, GS2, and GS3 and three gas supplying parts GS1, GS2, and GS3, are exemplarily illustrated in FIG. 3, the inventive concept is not limited to this example.

In an embodiment, the cleaning line CL may be connected to at least one of the gas supply lines GSL1, GSL2, and GSL3. The cleaning line CL may include valves V5-1, V5-2, and V5-3, each of which controls a flow of an incoming material provided from a corresponding one of the gas supply lines GSL1, GSL2, and GSL3 to the cleaning line CL. The valves V5-1, V5-2, and V5-3 may be respectively disposed adjacent to coupling portions between the cleaning line CL and the gas supply lines GSL1, GSL2, and GSL3.

Figure 4:
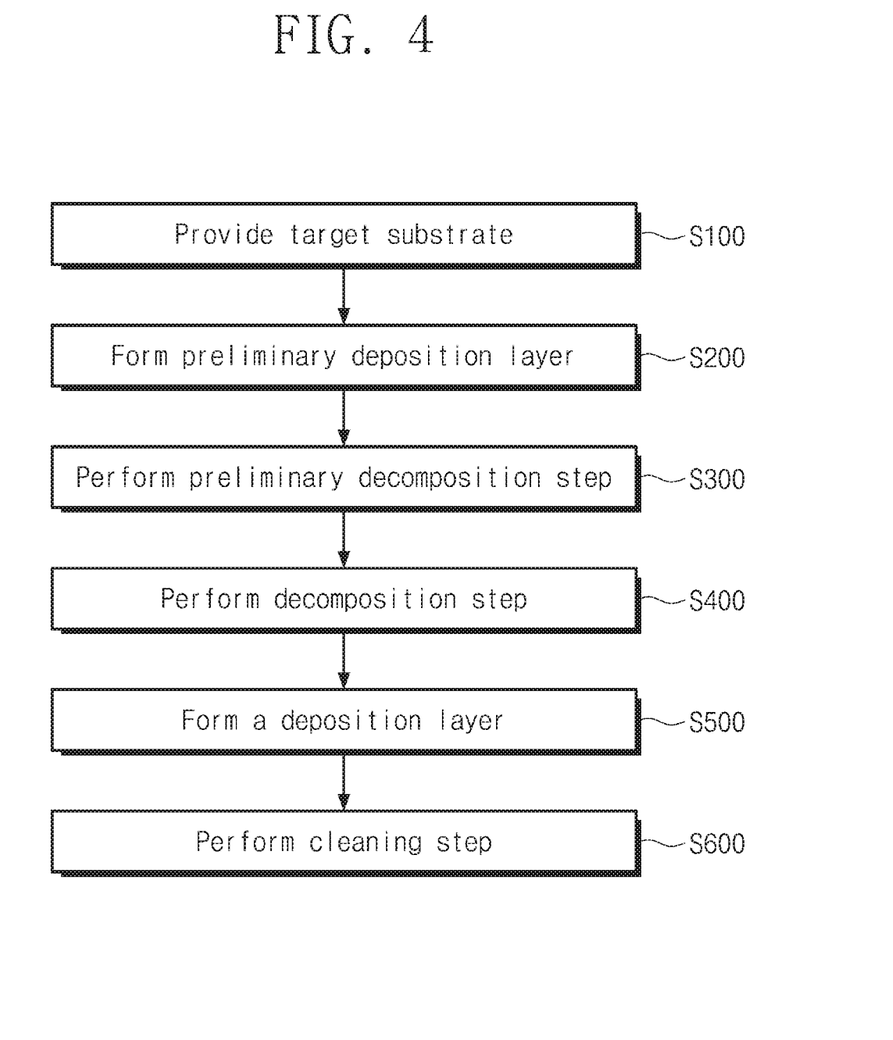
FIG. 4 is a block diagram illustrating a method of fabricating a display device according to an embodiment of the inventive concept.

FIG. 4 is a block diagram illustrating a method of fabricating a display device according to an embodiment of the inventive concept. FIGS. 5A to 5D are sectional views illustrating a display device according to an embodiment of the inventive concept. FIGS. 6A to 6C are sectional views illustrating a display device according to an embodiment of the inventive concept. In the following description, the same element as that of FIG. 1 will be identified by the same or similar reference number without repeating an overlapping description thereof. Hereinafter, a method of fabricating a display device using a deposition apparatus according to according to an embodiment of the inventive concept will be described with reference to FIGS. 1, and 4 to FIG. 6C.

Referring to FIG. 4, a method of fabricating a display device using the deposition apparatus DA according to an embodiment of the inventive concept may include providing a target substrate (in S100), forming a preliminary deposition layer (in S200), performing a preliminary decomposition step (in S300), performing a decomposition step (in S400), forming a deposition layer (in S500), and performing a cleaning step (in S600).

In step S100, the target substrate BS may be provided on the stage ST in the chamber CV. In an embodiment, the target substrate BS may be a layer on which a thin film is formed by the deposition process. The target substrate BS may be provided as a base layer on which elements of the display device are disposed or as a layer in which some elements of the display device are formed. For example, the target substrate BS may be provided to have a transistor, which is one of elements constituting a pixel displaying an image.

Thereafter, in step S200, a preliminary deposition layer may be formed by depositing the first material PR on the target substrate BS. The preliminary deposition layer may be defined as a layer which is created when the first material PR containing an organic material and a deposition material is deposited on the target substrate BS. The first material PR may be provided from the first supplying part SM1 to the entrance part SP1 of the shower head SH and may be deposited on the target substrate BS through the nozzle NZ of the injection part SP2.

In an embodiment, the step S200 may further include supplying a reaction gas which may be used to carry the first material PR into the chamber CV. Furthermore, in step S200, a flow rate of the reaction gas provided from the gas supplying part GS may be controlled by the flow controller MC.

In an embodiment, the internal pressure of the chamber CV may be further controlled. The pressure gauge PG may be used to obtain information on the internal pressure of the chamber CV and the information on the internal pressure of the chamber CV may be transmitted to the pressure controller PC. The pressure controller PC may control the vacuum pump VP based on the internal pressure information from the pressure gauge PG, thereby allowing the chamber CV to have an internal pressure suitable for the deposition process. The internal pressure in the chamber CV may be controlled by adjusting a flow rate or amount of the reaction gas to be supplied into the chamber CV.

In an embodiment, the reaction gas provided from the gas supplying part GS and the first material PR transported by reaction gas may be stored as a source gas in the first supplying part SM1. Thus, in the step S200 of forming the preliminary deposition layer, a material injected through the shower head SH of the chamber CV may be the source gas.

Thereafter, in the preliminary decomposition step S300, the preliminary deposition layer which is formed by depositing the first material PR may be heated to remove the organic material from the first material PR. Heat provided from the stage may be firstly used to remove the organic material contained in the first material PR. As the preliminary decomposition step S300 is further performed, some of organic materials which are initially contained in the first material PR may be removed from the preliminary deposition layer, but others may remain in the preliminary deposition layer. In the case where a final material to be deposited on the target substrate BS is one of metals or some target compounds, the remaining organic material may serve as a contaminant source causing the reliability issue of the display device. Accordingly, a step of removing the remaining organic material may be further performed.

Next, in steps S400 and S500, the second material OC containing an organic solvent may be injected on the preliminary deposition layer to remove the remaining organic material from preliminary deposition layer. As a result, a deposition layer may be formed.

By removing the remaining organic material from the preliminary deposition layer, the deposition material may remain in the first material PR to form a thin film which will be used as the deposition layer on the target substrate BS.

Thus, the deposition layer may be formed of a desired deposition material, and this may make it possible to improve reliability of a display device. Furthermore, the preliminary decomposition step and the decomposition step may be performed in the same chamber, and in this case, it may be possible to efficiently remove the organic material from the preliminary deposition layer without an additional step of controlling a process pressure and vacuum state. That is, it may be possible to reduce a process cost and time in a deposition process.

Thereafter, the cleaning step S600 is performed. The cleaning step S600 may include circulating the second material OC which is provided from the second supplying part SM2 through the deposition apparatus DA.

If the deposition process is finished, the organic material contained in the first material PR may be accumulated in internal spaces of the supply lines (e.g., the first supply line SML1, the gas line GSL, the vacuum line UPL, and the cleaning line CL) provided in the deposition apparatus DA, the first supplying part SM1, or the chamber CV.

In an embodiment, according to the afore-described method, the organic material accumulated in the internal spaces of several parts of the deposition apparatus DA may be removed or cleaned by the second material OC capable of decomposing the organic material, and thus, the deposition apparatus DA may be effectively cleaned, without an additional step of disassembling parts of the deposition apparatus DA or without an addition cost for a cleaning solution or a cleaning gas.

As schematically illustrated in FIGS. 5A to 5D, the deposition apparatus DA (e.g., see FIG. 1) may be used to form a deposition layer BI.

Figure 5A:
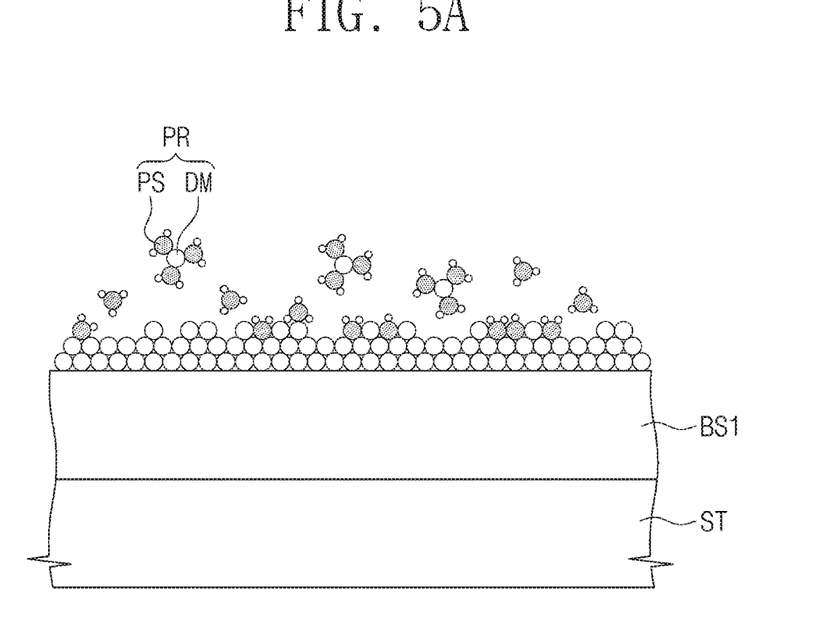
FIGS. 5A, 5B, 5C and 5D are sectional views illustrating a display device according to an embodiment of the inventive concept.
Figure 6A:
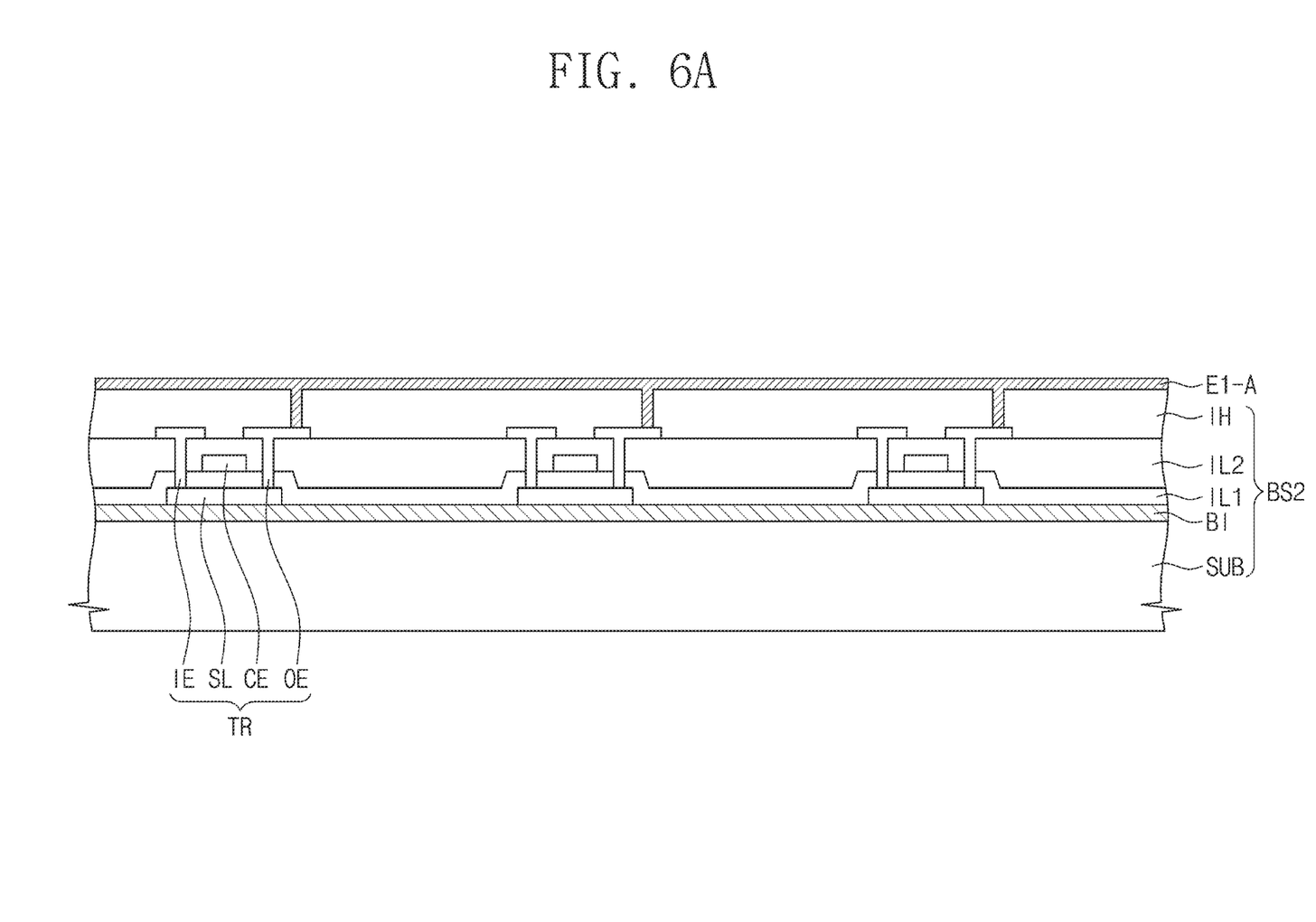
FIGS. 6A, 6B and 6C are sectional views illustrating a display device according to an embodiment of the inventive concept.
Figure 6B:
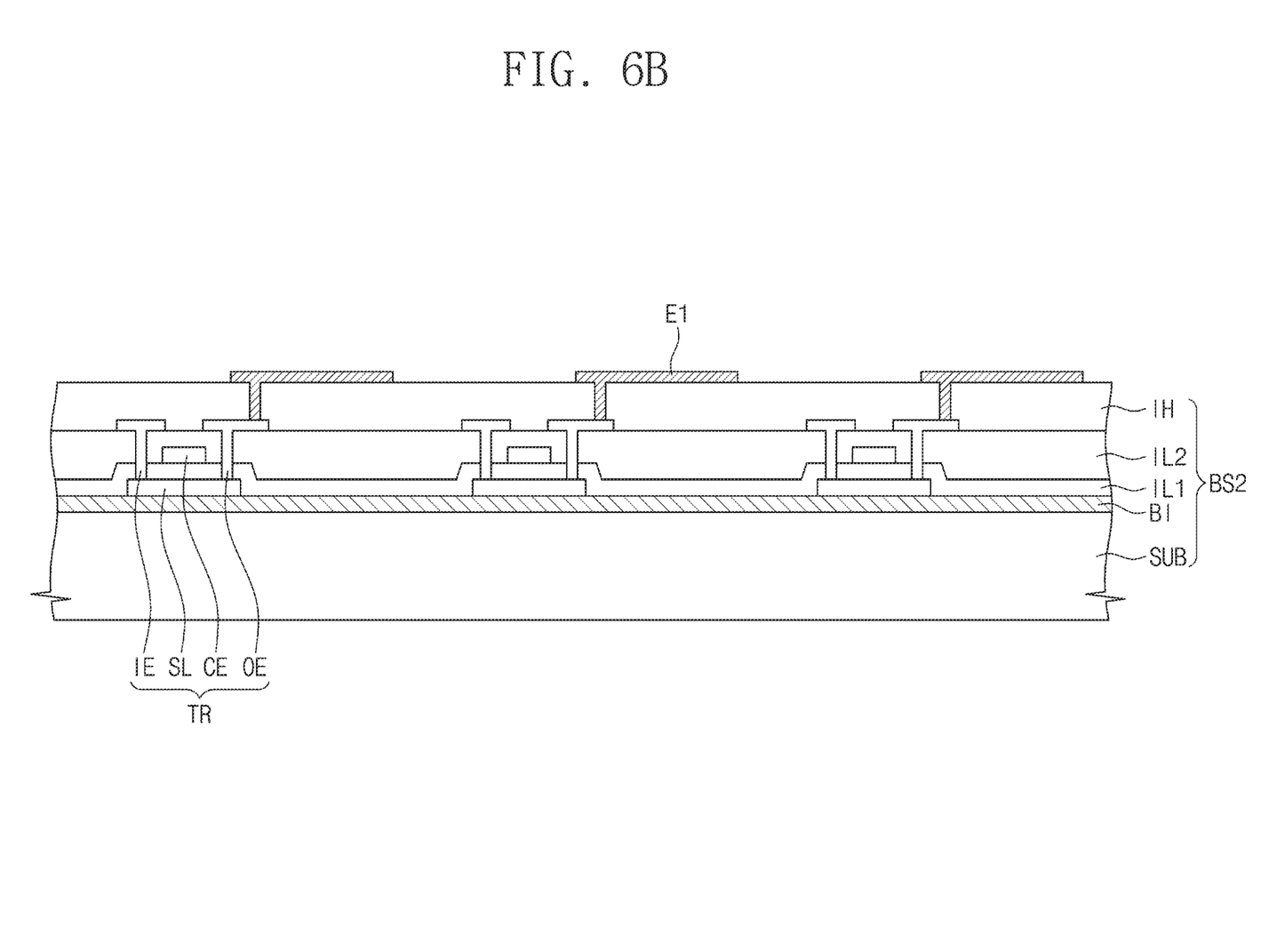
Figure 6C:
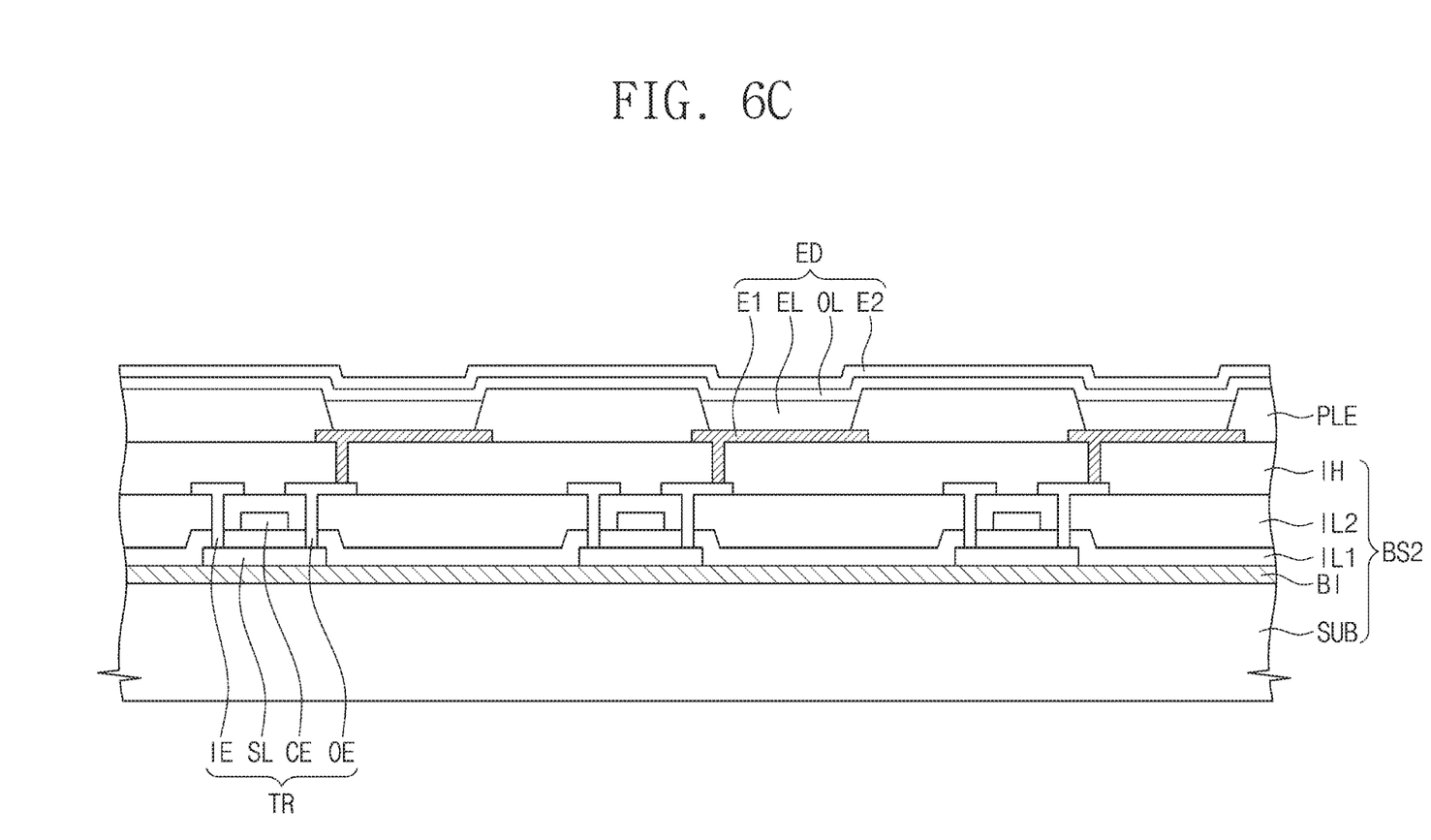

Referring to FIG. 5A, a target substrate BS1 may be provided as a base layer of a display device. For example, the target substrate BS1 may be a base layer on which a pixel including a transistor and so forth will be deposited.

The first material PR may be deposited on the target substrate BS1 to form a preliminary deposition layer. The first material PR may contain an organic material PS and a deposition material DM which are coupled to each other in the first material PR.

The organic material PS may contain $X(NMeEt)_4$. The deposition material DM may include zirconium (Zr) and/or hafnium (Hf). For example, the first material PR for the preliminary deposition layer may include at least one of $Zr(NMeEt)_4$ or $Hf(NMeEt)_4$.

In an embodiment, when the step of supplying the reaction gas is performed, a reaction gas (e.g., oxygen ($O_2$)) may be supplied from the gas supplying part GS.

Figure 5B:
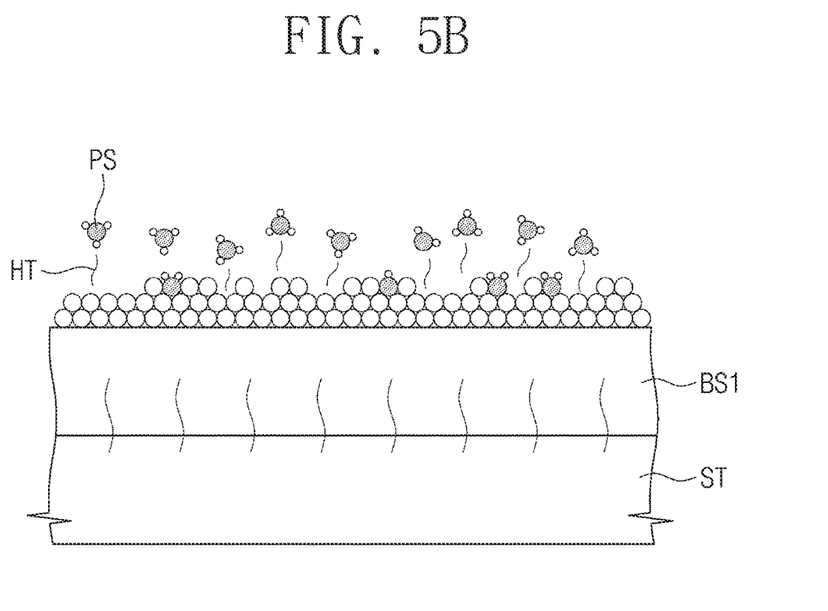

Referring to FIG. 5B, a preliminary decomposition step may be performed to remove the organic material PS from the preliminary deposition layer. The preliminary decomposition step may include heating the preliminary deposition layer. In an embodiment, the preliminary deposition layer may be heated by heat HT supplied from the stage ST. As a result of the preliminary decomposition step, the organic material PS constituting the first material PR in the preliminary deposition layer may be partly removed through a thermolysis process. After the thermolysis process, at least a portion of the organic material PS may remain in the preliminary deposition layer.

Figure 5C:
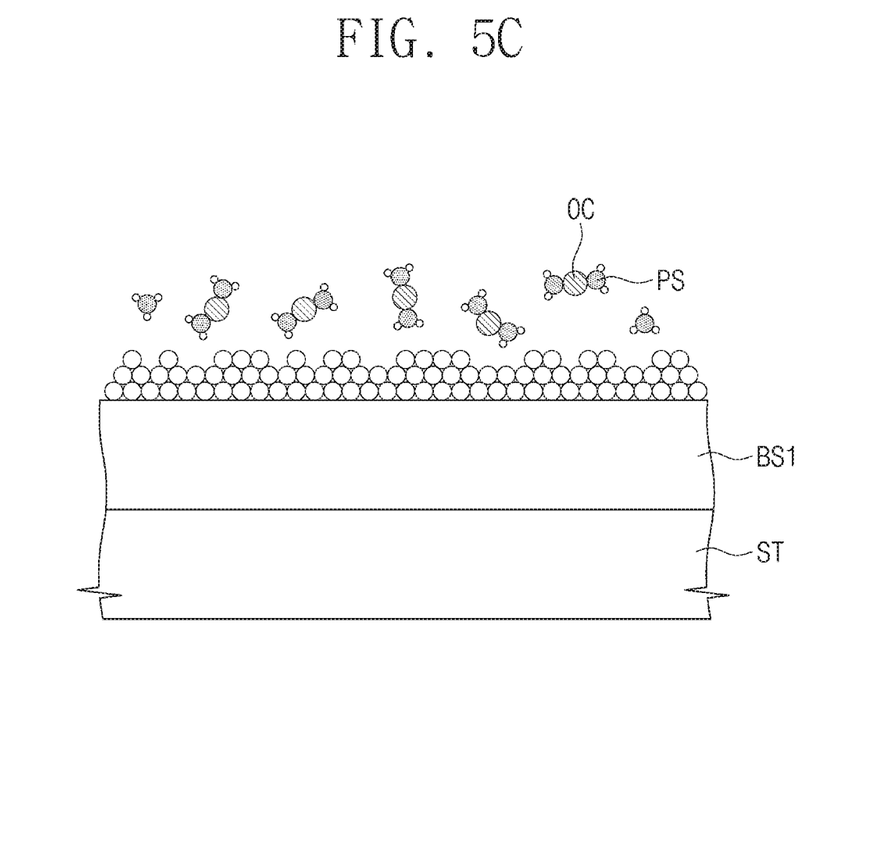

Next, referring to FIG. 5C, a decomposition step may be performed to remove the organic material PS remained in the preliminary deposition layer. In an embodiment, the decomposition step may include injecting or spraying the second material OC onto the preliminary deposition layer. As a result of the removal of the organic material PS, the desired material (i.e., the deposition material DM) may remain on the target substrate BS1.

Figure 5D:
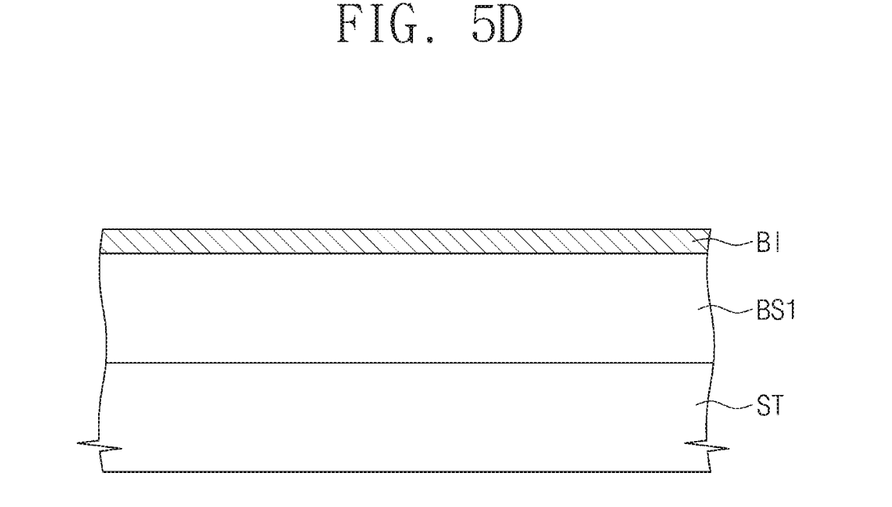

Thereafter, as shown in FIG. 5D, the deposition layer BI may be formed on the target substrate BS1, as a result of the decomposition step. In an embodiment, since the deposition layer BI is formed by removing the organic material PS remained in the preliminary deposition layer, a display device including the deposition layer BI may have improved reliability.

In an embodiment, in the case where oxygen ($O_2$) gas is supplied as the reaction gas, the deposition material DM may react with oxygen atoms to form a metal oxide layer (e.g., zirconium oxide ($ZrO_X$) or hafnium oxide ($HfO_X$)) serving as the deposition layer BI.

Referring to FIGS. 6A to 6C, the deposition apparatus DA (e.g., see FIG. 1) according to an embodiment of the inventive concept may be used to form a deposition layer E1-A.

In more detail, a target substrate BS2 may be provided, and in an embodiment, the target substrate BS2 may include a substrate SUB and a barrier layer BI, a transistor TR, and a plurality of insulating layers IL1, IL2, and IH formed on the substrate SUB. In an embodiment, the target substrate BS2 may be provided to further include the third insulating layer IH in which an opening is formed.

In an embodiment, the barrier layer BI may correspond to the deposition layer BI of FIG. 5D. The barrier layer BI may be formed on the substrate SUB. The barrier layer BI may prevent an external contamination material from entering into the layers on the barrier layer BI.

The transistor TR may be formed on the barrier layer BI. The transistor TR may include a semiconductor pattern SL, a control electrode CE, an input electrode IE, and an output electrode OE. The transistor TR may control a flow of electric charges passing through the semiconductor pattern SL in response to an electric signal applied to the control electrode CE. For example, the transistor TR may output an electrical signal from the input electrode IE to the output electrode OE in response to an electric signal applied to the control electrode CE.

The deposition layer E1-A may be formed on the third insulating layer IH. The deposition layer E1-A may be formed using the deposition apparatus DA (e.g., see FIG. 1) according to an embodiment of the inventive concept.

The formation of the deposition layer E1-A may include depositing the first material PR to form a preliminary deposition layer on the target substrate BS2. In an embodiment, the organic material PS of the first material PR may include [(n-Bu3P)X((CH3)(3)CCOO)]. The deposition material DM may include silver (Ag). For example, the first material PR for forming the preliminary deposition layer may include [(n-Bu3P)Ag((CH3)(3)CCOO)].

Thereafter, a preliminary decomposition step may be performed to remove the organic material PS. In an embodiment, the preliminary decomposition step may include heating the preliminary deposition layer. Thereafter, the second material OC may be injected or sprayed onto the preliminary deposition layer to remove the organic material PS remained in the preliminary deposition layer. As a result, only the desired deposition material DM (e.g., silver (Ag)) may remain in the deposition layer E1-A.

Thereafter, as shown in FIGS. 6B and 6C, the deposition layer E1-A may be patterned to form a first electrode E1. Thereafter, a pixel definition layer PLE may be formed to expose the first electrode E1, and a light emitting layer EL, a charge control layer OL, and a second electrode E2 constituting an organic light emitting device ED may be formed on the first electrode E1 exposed by the pixel definition layer PLE.

According to an embodiment of the inventive concept, a metal organic precursor and a material, which can decompose an organic material contained in the metal organic precursor, are injected into a deposition apparatus. Accordingly, in order to decompose the organic material contained in the metal organic precursor, it is not necessary to perform an additional step for controlling pressure and vacuum state, and thus, in the case where the deposition apparatus is used to form a thin film, it is possible to reduce process cost and time.

In addition, by circulating a material, which is effective in removing the organic material contained in the metal organic precursor in an internal space of the deposition apparatus, it may be possible to reduce time required to clean the deposition apparatus. Thus, in the case where the deposition apparatus is used to form a thin film, it may be possible to improve process efficiency of a thin film forming process.

While an embodiment of the inventive concepts has been particularly shown and described, it will be understood by one of ordinary skill in the art that variations in form and detail may be made therein without departing from the spirit and scope of the attached claims.

What is claimed is:

1. A deposition apparatus, comprising:
   a chamber providing a specific internal space, the chamber comprising a stage disposed in the internal space and on which a target substrate is disposed;
   a first supplying part connected to the chamber via a first supply line;
   a precursor supplying part filled with an organic material and a deposition material, and connected to the first supplying part via a gas line;
   a gas supplying part filled with a reaction gas and connected to the first supplying part via the gas line;
   a second supplying part spaced apart from the first supplying part, connected to the chamber via a second supply line which directly connects the second supplying part to the chamber, and filled with a second material including an organic solvent which decomposes the organic material of the first material;
   a shower head disposed in the internal space and connected to the first supplying part and the second supplying part, the shower head comprising a nozzle injecting the first material or the second material toward the target substrate; and
   a cleaning line directly connects the vacuum pump to the gas line,
   wherein the cleaning line is connected to the gas line disposed between the gas supplying part and a flow controller which is connected to the gas line disposed between the gas supplying part and the precursor supplying part.

2. The deposition apparatus of claim 1,
   wherein the first material is provided to the shower head through the first supply line and the second material is provided to the shower head through the second supply line.

3. The deposition apparatus of claim 1, further comprising a vacuum pump connected to the chamber.

4. The deposition apparatus of claim 3, further comprising:
   a pressure gauge measuring an internal pressure of the chamber; and
   a pressure controller connected to the pressure gauge,
   wherein the pressure controller is connected to the vacuum pump.

5. The deposition apparatus of claim 1, wherein the first supply line directly connects the first supplying part to the chamber.

6. The deposition apparatus of claim 5, wherein the first supply line and the second supply line are not physically connected to each other.

* * * * *